(12) United States Patent  
Ahmed (10) Patent No.: US 9,082,793 B1  
(45) Date of Patent: Jul. 14, 2015

(54) IGZO DEVICES WITH REDUCED THRESHHOLD VOLTAGE SHIFT AND METHODS FOR FORMING THE SAME

(71) Applicant: Intermolecular, Inc., San Jose, CA (US)

(72) Inventor: Khaled Ahmed, Anaheim, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 14/135,534

(22) Filed: Dec. 19, 2013

(51) Int. Cl.  
*H01L 29/12* (2006.01)  
*H01L 29/66* (2006.01)  
*H01L 29/786* (2006.01)

(52) U.S. Cl.  
CPC ...... *H01L 29/66969* (2013.01); *H01L 29/7869* (2013.01); *H01L 29/78606* (2013.01)

(58) Field of Classification Search  
CPC .................................................. H01L 29/7869  
USPC .......................................... 257/43; 438/104  
See application file for complete search history.

(56) References Cited

U.S. PATENT DOCUMENTS

| | | | |
|---|---|---|---|
| 2009/0321731 A1* | 12/2009 | Jeong et al. | 257/43 |
| 2010/0193784 A1* | 8/2010 | Morosawa et al. | 257/43 |
| 2013/0005081 A1* | 1/2013 | Chen et al. | 438/104 |
| 2013/0280859 A1* | 10/2013 | Kim et al. | 438/104 |

OTHER PUBLICATIONS

Thankalekshmi et al.; Structure and optical band gap of $ZnO_{1-x}S_x$ thin films synthesized by chemical spray pyrolysis for application in solar cells; Sep. 21, 2012; Journal of Applied Physics; American Institute of Physics; pp. 063708-1-063708-10.

Chen et al.; Measurement of $Zn_{0.95}Cd_{0.05}O/ZnO$ (0001) heterojunction band offsets by x-ray photoelectron spectroscopy; Nov. 3, 2005; Applied Physics Letters; American Institute of Physics; pp. 192106-1-192106-3.

* cited by examiner

*Primary Examiner* — Steven Loke  
*Assistant Examiner* — Arash Majdi (57) ABSTRACT

Embodiments described herein provide indium-gallium-zinc oxide (IGZO) devices, such as IGZO thin-film transistors (TFTs), and methods for forming such devices. A substrate is provided. A gate electrode is formed above the substrate. A gate dielectric layer is formed above the gate electrode. An interface layer is formed above the gate dielectric material. An IGZO channel layer is formed above the interface layer. A source electrode and a drain electrode are formed above the IGZO channel layer. The interface layer includes a material different than that of the gate dielectric layer and the IGZO channel layer.

20 Claims, 9 Drawing Sheets

IGZO DEVICES WITH REDUCED THRESHHOLD VOLTAGE SHIFT AND METHODS FOR FORMING THE SAME

TECHNICAL FIELD

The present invention relates to indium-gallium-zinc oxide (IGZO) devices. More particularly, this invention relates to methods for forming IGZO devices, such as thin-film transistors (TFTs), with reduced threshold voltage shift and methods for forming such devices.

BACKGROUND OF THE INVENTION

Indium-gallium-zinc oxide (IGZO) devices, such as IGZO thin-film transistors (TFTs) have attracted a considerable amount of attention due to the associated low cost, room temperature manufacturing processes with good uniformity control, high mobility for high speed operation, and the compatibility with transparent, flexible, and light display applications. Due to these attributes, IGZO TFTs may even be favored over low cost amorphous silicon TFTs and relatively high mobility polycrystalline silicon TFT for display device applications. IGZO devices typically utilize amorphous IGZO (a-IGZO).

Recent developments in the field suggest that the use of crystalline IGZO may provide improved electrical and chemical stability in certain conditions. However, IGZO TFTs may lack electrical stability under negative bias illumination temperature stress (NBITS). A complete understanding of why this instability occurs in oxide semiconductors is crucial to prevent it from happening, and there have been many attempts to explain its origin, the major two arguments being the charge trapping model and the ion diffusion model. Recent reports support the charge trapping model, where holes generated in the IGZO layer upon illumination tunnel into traps in the gate dielectric when the gate electrode is negatively biased and cause a negative threshold shift.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

The term "horizontal" as used herein will be understood to be defined as a plane parallel to the plane or surface of the substrate, regardless of the orientation of the substrate. The term "vertical" will refer to a direction perpendicular to the horizontal as previously defined. Terms such as "above", "below", "bottom", "top", "side" (e.g. sidewall), "higher", "lower", "upper", "over", and "under", are defined with respect to the horizontal plane. The term "on" means there is direct contact between the elements. The term "above" will allow for intervening elements.

Some embodiments described herein provide indium-gallium-zinc oxide (IGZO) devices, such as IGZO thin-film transistors (TFTs), with reduced threshold voltage shift, such as when under negative bias illumination temperature stress (NBITS). In some embodiments, to address this problem, the "hole barrier height" at the interface of the gate dielectric and the IGZO channel layer is increased.

In some embodiments, this is accomplished by forming an oxide layer above the gate dielectric before the IGZO channel layer is formed. In some embodiments, this oxide layer includes zinc oxide and/or IGZO and is doped with sulfur and/or cadmium. In embodiments in which the gate dielectric is made of silicon nitride, the oxide layer may also be silicon oxide. The oxide layer may have a thickness of, for example, between about 2 nanometers (nm) and about 12 nm (preferably 5-10 nm). The oxide layer may be formed using, for example, physical vapor deposition (PVD), with targets of the appropriate materials (e.g., sulfur-doped zinc oxide, cadmium-doped IGZO, etc.).

Figure 1:
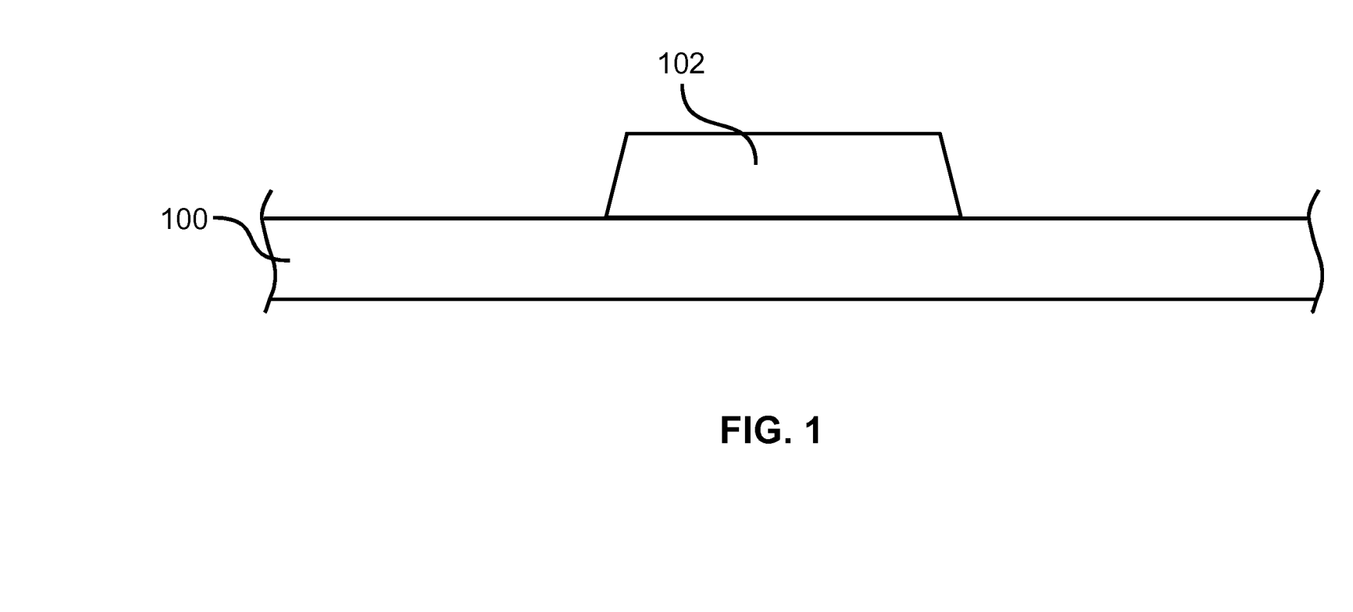
FIG. 1 is a cross-sectional view of a substrate with gate electrode formed above.

FIGS. 1-7 illustrate a method for forming an IGZO TFT (or more generically, an IGZO device), according to some embodiments. Referring now to FIG. 1, a substrate 100 is shown. In some embodiments, the substrate 100 is transparent and is made of, for example, glass. The substrate 100 may have a thickness of, for example, between about 0.01 centimeters (cm) and about 0.5 cm. Although only a portion of the substrate 100 is shown, it should be understood that the substrate 100 may have a width of, for example, between about 5.0 cm and about 4.0 meters (m). Although not shown, in some embodiments, the substrate 102 may have a dielectric layer (e.g., silicon oxide) formed above an upper surface thereof. In such embodiments, the components described below are formed above the dielectric layer. Also, in some embodiments, the substrate 100 is at least partially made of a of a semiconductor material (e.g., silicon, germanium, gallium arsenide, etc.). For example, in some embodiments, the substrate includes glass with a layer of semiconductor material formed thereon.

Still referring to FIG. 1, a gate electrode 102 is formed above the substrate 100. In some embodiments, the gate electrode 102 is made of a conductive material, such as copper, silver, aluminum, manganese, molybdenum, or a combination thereof. The gate electrode may have a thickness of, for example, between about 20 nm and about 500 nm. Although not shown, it should be understood that in some embodiments, a seed layer (e.g., a copper alloy) is formed between the substrate 100 and the gate electrode 102.

It should be understood that the various components above the substrate, such as the gate electrode 102 and those described below, are formed using processing techniques suitable for the particular materials being deposited, such as PVD (e.g., co-sputtering in some embodiments), chemical vapor deposition (CVD), plasma-enhanced CVD (PECVD), electroplating, etc. Furthermore, although not specifically shown in the figures, it should be understood that the various components formed above the substrate 100, such as the gate electrode 102, may be sized and shaped using a photolithography process and an etching process, as is commonly understood, such that the components are formed above selected regions of the substrate 100.

Figure 2:
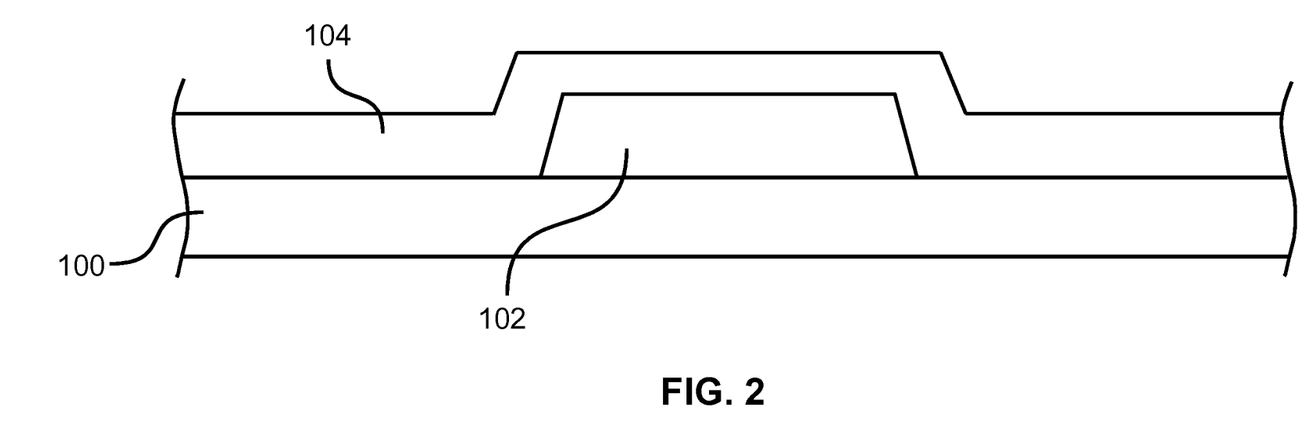
FIG. 2 is a cross-sectional view of the substrate of FIG. 1 with a gate dielectric layer formed above the gate electrode and the substrate.

Referring to FIG. 2, a gate dielectric layer 104 is then formed above the gate electrode 102 and the exposed portions of the substrate 100. The gate dielectric layer 104 may be made of, for example, silicon oxide, silicon nitride, or a high-k dielectric (e.g., having a dielectric constant greater than 3.9), such as zirconium oxide, hafnium oxide, or aluminum oxide.

In some embodiments, the gate dielectric layer 104 has a thickness of, for example, between about 10 nm and about 500 nm, preferably between about 30 nm and about 100 nm.

Figure 3:
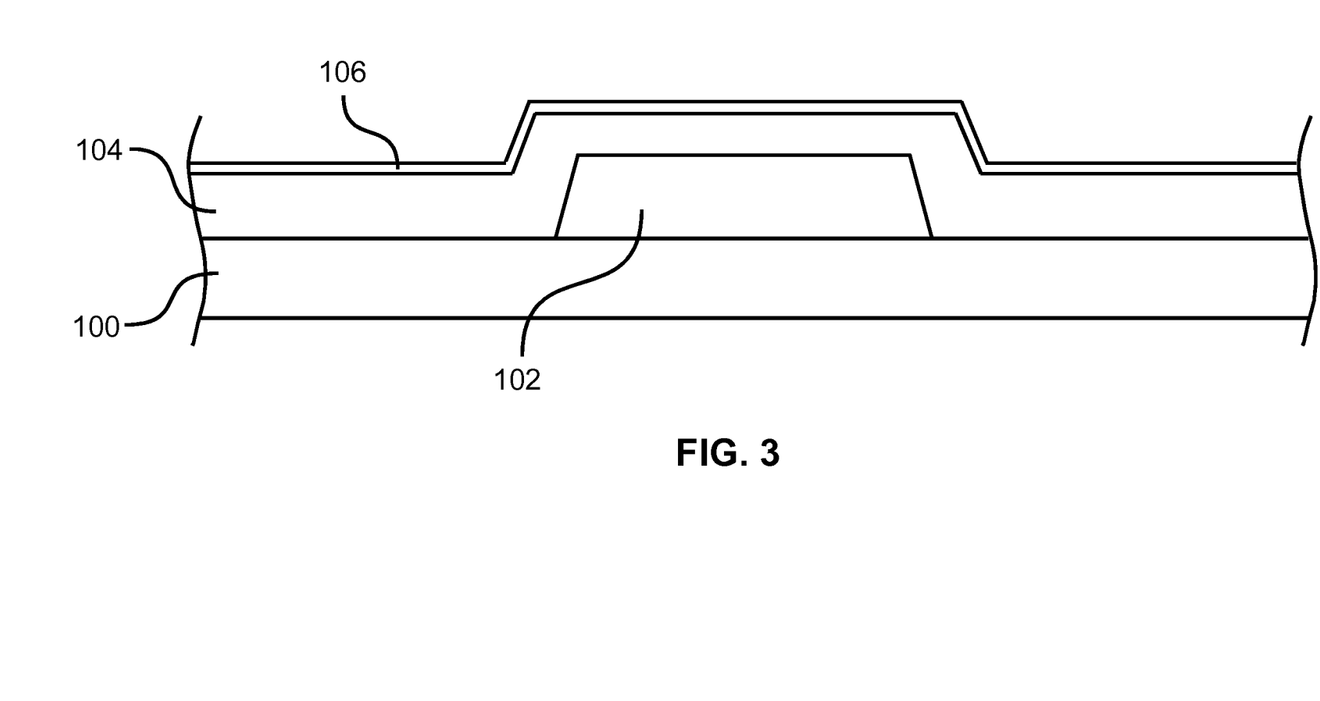
FIG. 3 is a cross-sectional view of the substrate of FIG. 2 with an interface layer formed above the gate dielectric layer.

As shown in FIG. 3, an interface (or barrier) layer (or gate interface layer) 106 is formed above the gate dielectric layer 104. The interface layer 106 may include (or be made of) zinc oxide, IGZO, or a combination thereof. The interface layer 106 may be doped with sulfur, cadmium, or a combination thereof (e.g., 20-40% doping). In some embodiments, the interface layer 106 is made of sulfur-doped zinc oxide, cadmium-doped zinc oxide, sulfur-doped IGZO, cadmium-doped IGZO, or a combination thereof. In such embodiments, the interface layer 106 may be formed from using PVD in which the material is ejected from appropriately doped targets (e.g., a sulfur-doped zinc oxide target, a cadmium-doped IGZO target, etc.) In embodiments in which the interface layer 106 is doped with sulfur, the interface layer 106 may be formed using reactive sputtering in which the material is ejected from an appropriate target in a gaseous environment that includes hydrogen sulfide gas ($H_2S$) (e.g., about 4% hydrogen sulfide gas).

In embodiments in which the gate dielectric layer 104 is made of silicon nitride, the interface layer 106 may (also) be made of silicon oxide. The interface layer may have a thickness of, for example, between about 2 nm and about 12 nm, preferably between about 5 nm and about 10 nm.

Figure 4:
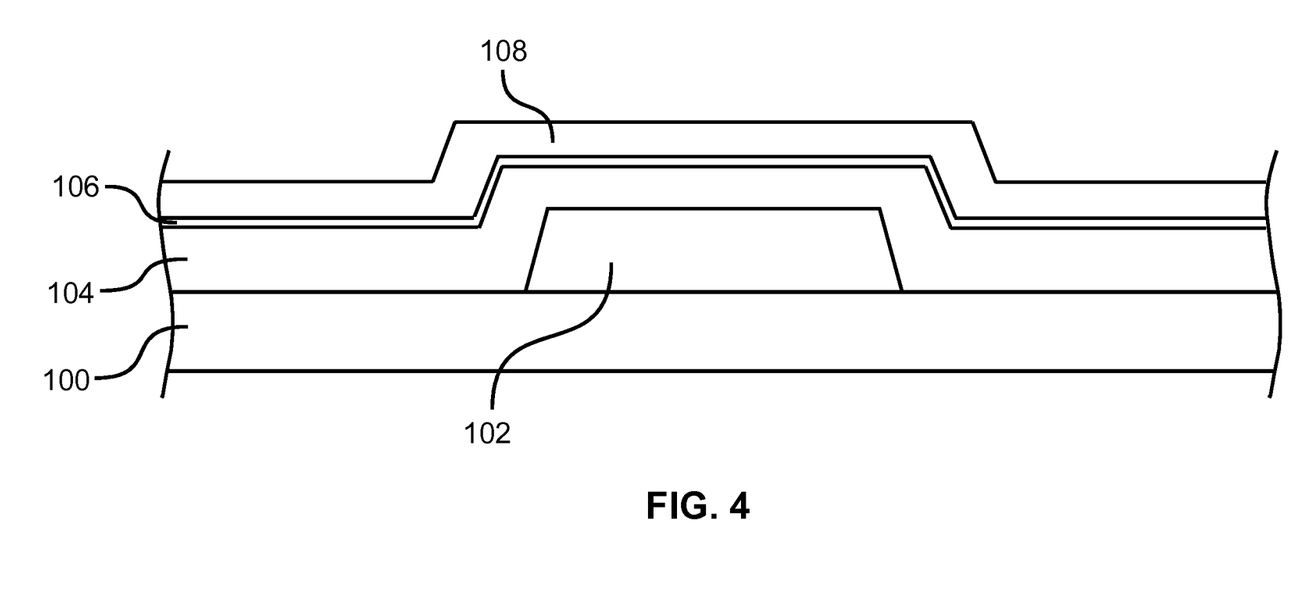
FIG. 4 is a cross-sectional view of the substrate of FIG. 3 with an indium-gallium-zinc oxide (IGZO) layer formed above the interface layer.

Referring now to FIG. 4, an IGZO layer 108 is then formed above the interface layer 106. The IGZO layer 108 may be made of IGZO in which a ratio of the respective elements is, for example, 1:1:1:1-3. In some embodiments, the IGZO within the IGZO layer 108 is deposited as amorphous IGZO (a-IGZO). However, in some embodiments, the IGZO is formed or deposited using processing conditions to enhance the crystalline structure thereof. In some embodiments, the IGZO layer 108 is formed using PVD. The IGZO may be deposited from a single target that includes indium, gallium, and zinc (e.g., an indium-gallium-zinc alloy target or an IGZO target), but two or more targets may also used (e.g., co-sputtering with an indium-zinc target and a gallium target). The IGZO layer 108 may have a thickness of, for example, between about 10 nm and about 100 nm, such as about 50 nm. It should be noted that in at least some embodiments, the IGZO layer 108 (and the IGZO channel layer described below), the interface layer 106, and the gate dielectric layer 104 are all made of different materials (e.g., the interface layer 106 is made of a different material than the gate dielectric layer 104 and the IGZO layer 108).

Although not specifically shown, in some embodiments, the IGZO layer 108 (and the other components shown in FIG. 4) may then undergo an annealing process. In some embodiments, the annealing process includes a relatively low temperature (e.g., less than about 600° C., preferably less than about 450° C.) heating process in, for example, an ambient gaseous environment (e.g., nitrogen, oxygen, or ambient/air) to (further) enhance the crystalline structure of the IGZO. The heating process may occur for between about 1 minute and about 200 minutes.

After the annealing (or heating) process, the IGZO layer 108 may (substantially) include crystalline IGZO (c-IGZO). As used herein a "crystalline" material (e.g., c-IGZO) may be considered to be one that is more than 30% crystalline by volume, as determined by a technique such as X-ray Diffraction (XRD). In some embodiments, the c-IGZO is c-axis aligned crystal (CAAC) IGZO, as is commonly understood.

Figure 5:
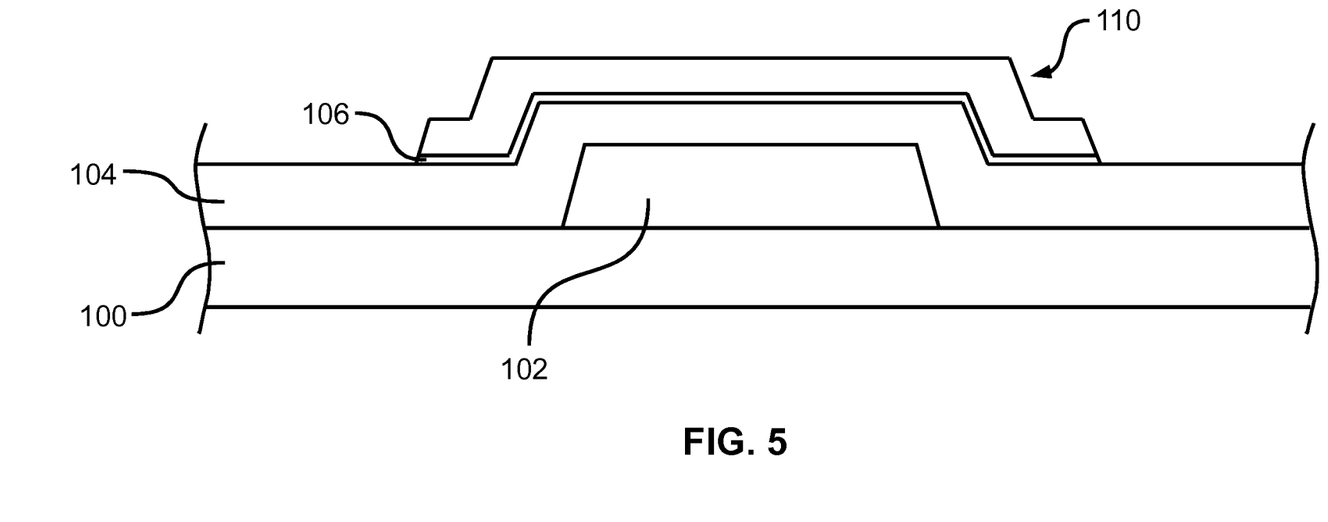
FIG. 5 is a cross-sectional view of the substrate of FIG. 4 with an IGZO channel layer formed above the interface layer.

Referring to FIG. 5, after the annealing process, the IGZO layer 108 is patterned (e.g., etched) to form an IGZO channel (or channel layer) 110 (e.g., made of substantially c-IGZO) above the interface layer 106, over the gate electrode 102. In the depicted embodiment, the interface layer 106 has also been patterned/etched (e.g., using the same, or a different, etching process used to define the IGZO channel layer 110) such that the only remaining portions of the interface layer 106 are directly between the gate dielectric layer 104 and the IGZO channel layer 110. In such embodiments, the interface layer 104 may be considered to be a portion of the IGZO channel layer 110 (i.e., a composite or bi-layer IGZO channel layer). However, in some embodiments, the interface layer 106 is not patterned and is left as shown in FIGS. 3 and 4.

Figure 6:
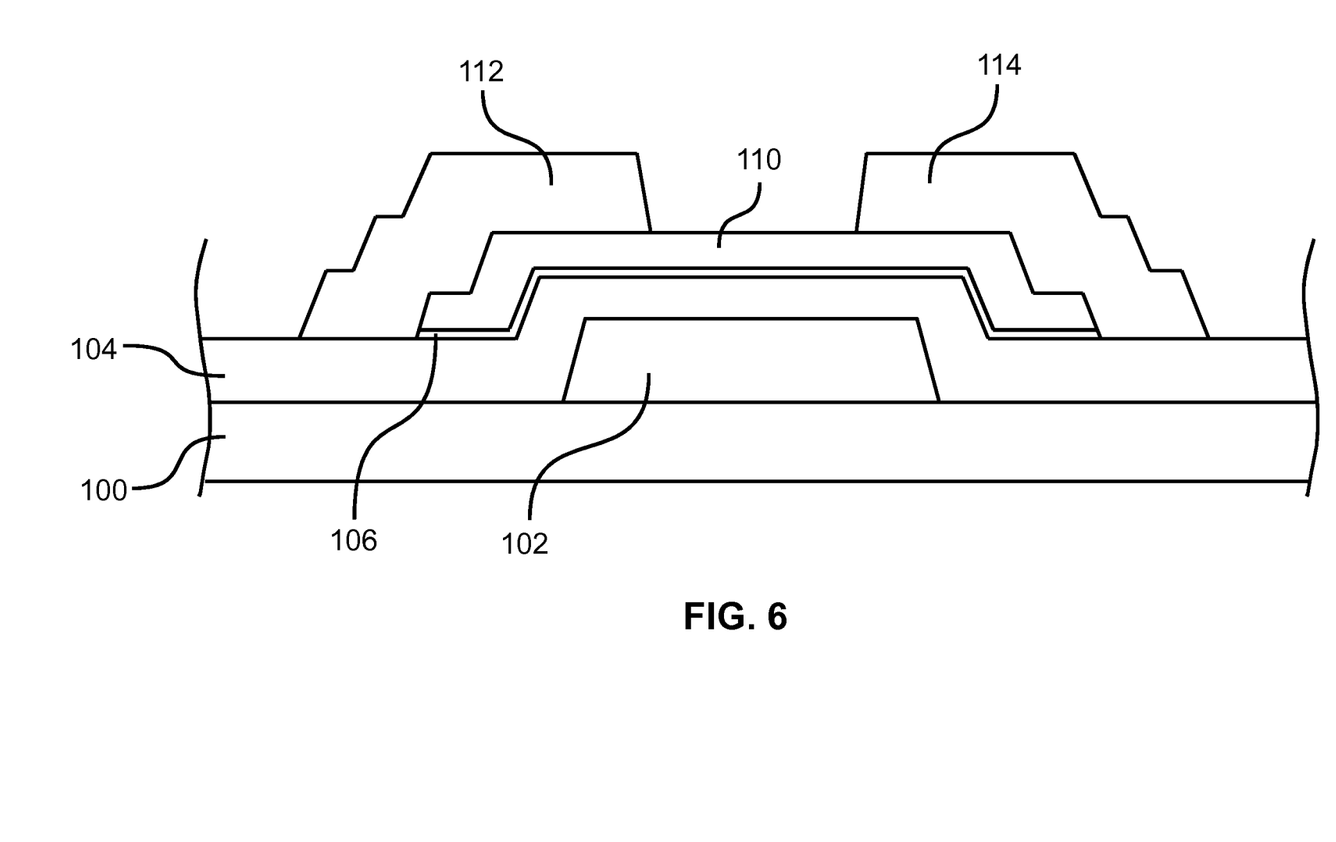
FIG. 6 is a cross-sectional view of the substrate of FIG. 5 with source and drain electrodes formed above the IGZO channel layer.

Referring now to FIG. 6, a source electrode (or region) 112 and a drain electrode (or region) 114 are then formed above the IGZO channel layer 110. As shown, the source electrode 112 and the drain electrode 114 lie on opposing sides of, and partially overlap the ends of, the IGZO channel layer 110 (and the interface layer 106 in the depicted embodiment). As will be appreciated by one skilled in the art, the source electrode 112 and the drain electrode 114 may be defined as shown in FIG. 6 using a "back-channel etch" (BCE) process to, for example, form the gap between the source electrode 112 and the drain electrode 114, which is vertically aligned with the gate electrode 102. However, in some embodiments, an etch-stop layer, as is commonly understood, may be formed above the IGZO channel layer 110 to facilitate the defining of the source electrode 112 and the drain electrode 114 (e.g., by protecting the IGZO during the etch process).

In some embodiments, the source electrode 112 and the drain electrode 114 are made of titanium, aluminum, molybdenum, copper, copper-manganese alloy, or a combination thereof. In some embodiments, the source electrode 112 and the drain electrode 114 include multiple sub-layers (e.g., sub-layers of titanium and titanium nitride). The source electrode 112 and the drain electrode 114 may have a thickness of, for example, between about 20 nm and 500 nm.

Figure 7:
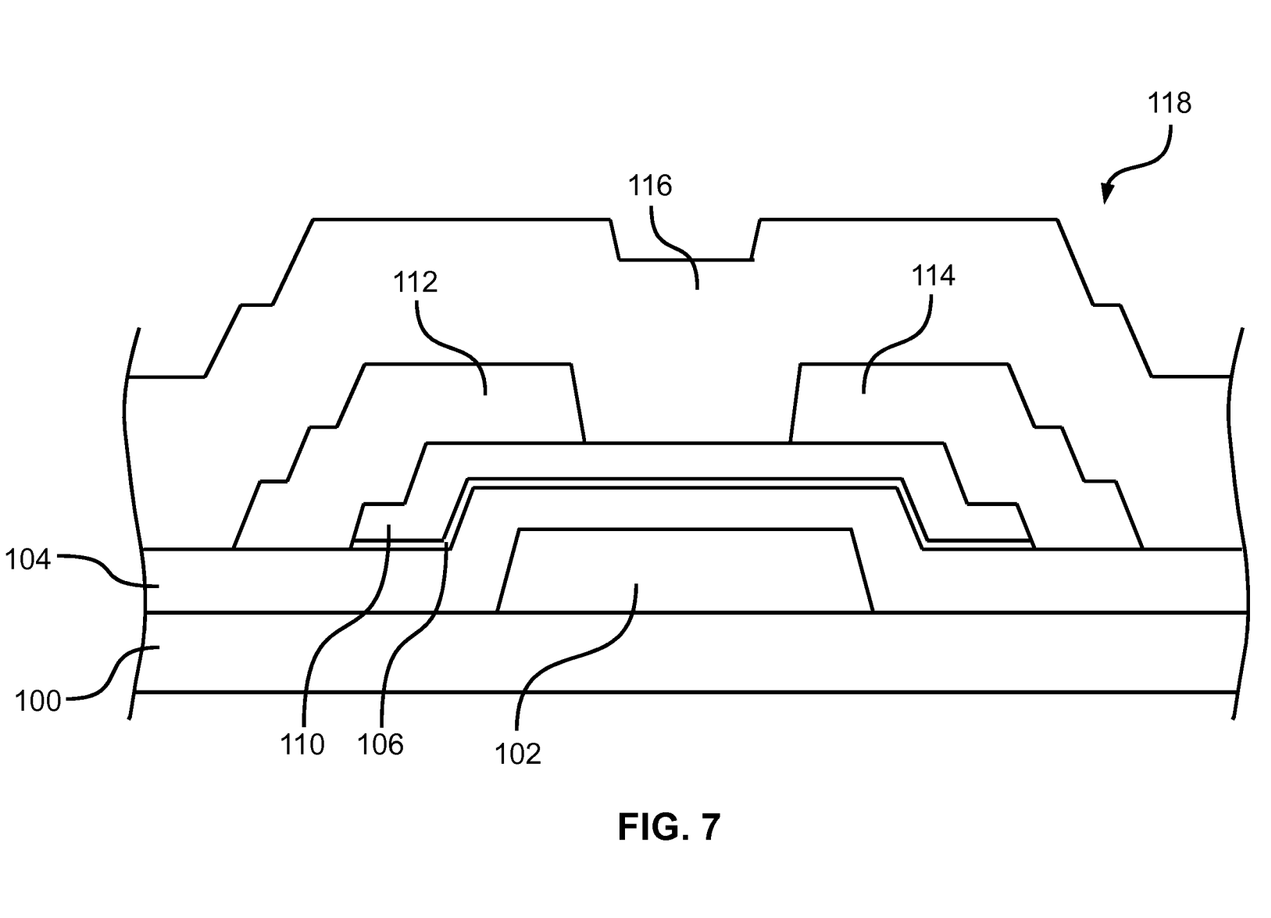
FIG. 7 is a cross-sectional view of the substrate of FIG. 6 with a passivation layer formed above the source and drain electrodes.

Referring to FIG. 7, a passivation layer 116 is then formed above the source electrode 112, the drain electrode 114, and the exposed portions of the gate dielectric layer 104 and the IGZO channel layer 110. In some embodiments, the passivation layer 116 is made of silicon oxide, silicon nitride, aluminum oxide, aluminum nitride, or a combination thereof and has a thickness of, for example, between about 0.1 micrometers (μm) and about 1.5 μm.

The deposition of the passivation layer 116 may substantially complete the formation of an IGZO device 118, such as an inverted, staggered bottom-gate IGZO TFT. It should be understood that although only a single device 118 is shown as being formed on a particular portion of the substrate 100 in FIGS. 1-7, the manufacturing processes described above may be simultaneously performed on multiple portions of the substrate 100 such that multiple devices 118 are simultaneously formed, as is commonly understood. Further, although not shown, in some embodiments, such as those intended for use in display applications, pixel electrodes may also be formed above the substrate 100 during the formation of the IGZO device(s) 118. The pixel electrodes may be made of a transparent conductive material, such as indium-tin oxide (ITO).

The presence of the interface layers(s) described above enhances the "hole barrier height" at the interface between the gate dielectric layer and the IGZO. As a result, the tunneling and trapping of holes in the gate dielectric layer is reduced (i.e., compared to conventional IGZO devices without the interface layer). Thus, the threshold voltage shift of the device may be reduced, particularly under negative bias illumination temperature stress (NBITS).

Figure 8:
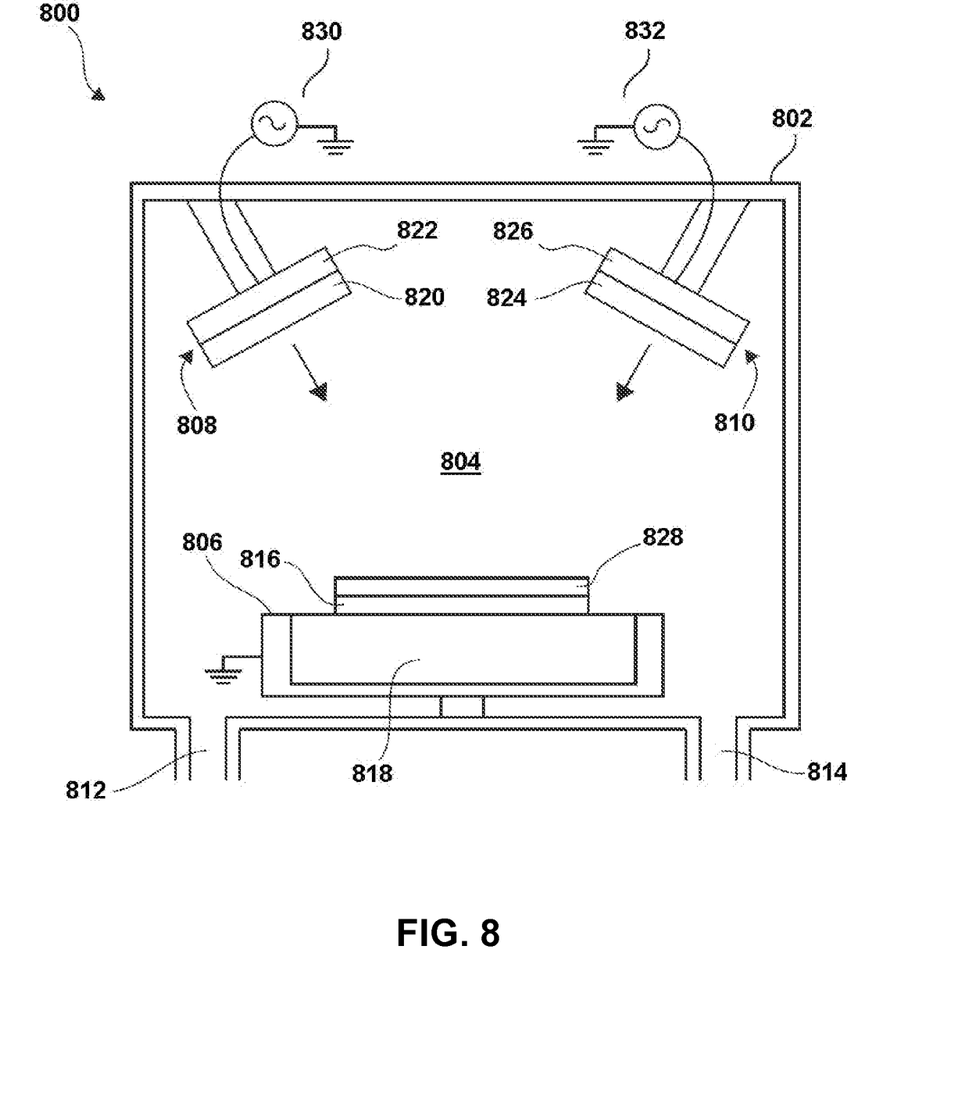
FIG. 8 is a simplified cross-sectional diagram of a physical vapor deposition (PVD) tool according to some embodiments.

FIG. 8 provides a simplified illustration of a physical vapor deposition (PVD) tool (and/or system) 800 which may be used, in some embodiments, to form the IGZO channel layers and contact layers (and/or other components of the IGZO devices), described above. The PVD tool 800 shown in FIG. 8 includes a housing 802 that defines, or encloses, a processing chamber 804, a substrate support 806, a first target assembly 808, and a second target assembly 810.

The housing 802 includes a gas inlet 812 and a gas outlet 814 near a lower region thereof on opposing sides of the substrate support 806. The substrate support 806 is positioned near the lower region of the housing 802 and in configured to support a substrate 816. The substrate 816 may be a round substrate having a diameter of, for example, about 200 mm or about 300 mm. In other embodiments (such as in a manufacturing environment), the substrate 816 may have other shapes, such as square or rectangular, and may be significantly larger (e.g., about 0.5 m to about 4 m across). The substrate support 806 includes a support electrode 818 and is held at ground potential during processing, as indicated.

The first and second target assemblies (or process heads) 808 and 810 are suspended from an upper region of the housing 802 within the processing chamber 804. The first target assembly 808 includes a first target 820 and a first target electrode 822, and the second target assembly 810 includes a second target 824 and a second target electrode 826. As shown, the first target 820 and the second target 824 are oriented or directed towards the substrate 816. As is commonly understood, the first target 820 and the second target 824 include one or more materials that are to be used to deposit a layer of material 828 on the upper surface of the substrate 816.

The materials used in the targets 820 and 824 may, for example, include indium, gallium, zinc, tin, silicon, silver, aluminum, manganese, molybdenum, zirconium, hathium, titanium, copper, or any combination thereof (i.e., a single target may be made of an alloy of several metals). In some embodiments, the materials used in the targets may include oxygen, nitrogen, or a combination of oxygen and nitrogen in order to form oxides, nitrides, and oxynitrides. Additionally, in some embodiments, the material(s) in the targets are doped (e.g., with sulfur and/or cadmium) as described above (e.g., sulfur-doped zinc oxide, cadmium-doped IGZO, etc.). Further, although only two targets 820 and 824 are shown, additional targets may be used.

The PVD tool 800 also includes a first power supply 830 coupled to the first target electrode 822 and a second power supply 832 coupled to the second target electrode 824. As is commonly understood, in some embodiments, the power supplies 830 and 832 pulse direct current (DC) power to the respective electrodes, causing material to be, at least in some embodiments, simultaneously sputtered (i.e., co-sputtered) from the first and second targets 820 and 824. In some embodiments, the power is alternating current (AC) to assist in directing the ejected material towards the substrate 816.

During sputtering, inert gases (or a plasma species), such as argon or krypton, may be introduced into the processing chamber 804 through the gas inlet 812, while a vacuum is applied to the gas outlet 814. The inert gas(es) may be used to impact the targets 820 and 824 and eject material therefrom, as is commonly understood. In embodiments in which reactive sputtering is used, reactive gases, such as oxygen and/or nitrogen, may also be introduced, which interact with particles ejected from the targets (i.e., to form oxides, nitrides, and/or oxynitrides).

Although not shown in FIG. 8, the PVD tool 800 may also include a control system having, for example, a processor and a memory, which is in operable communication with the other components shown in FIG. 8 and configured to control the operation thereof in order to perform the methods described herein.

Although the PVD tool 800 shown in FIG. 8 includes a stationary substrate support 806, it should be understood that in a manufacturing environment, the substrate 816 may be in motion (e.g., an in-line configuration) during the formation of various layers described herein.

Figure 9:
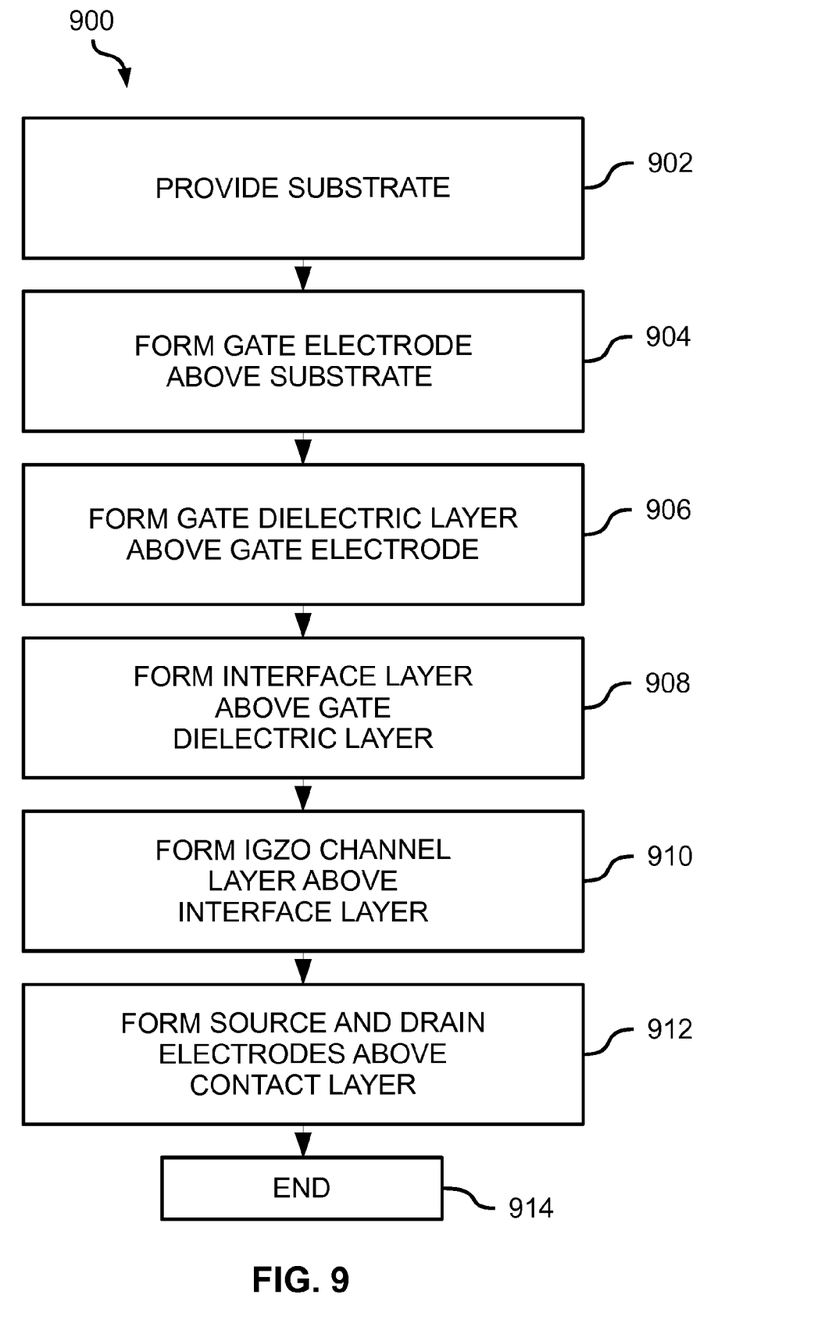
FIG. 9 is a flow chart illustrating a method for forming IGZO devices according to some embodiments.

FIG. 9 illustrates a method 900 for forming IGZO devices, such as IGZO TFTs, according to some embodiments. At block 902, the method 900 begins with a substrate being provided. As described above, in some embodiments, the substrate includes glass, a semiconductor material, or a combination thereof.

At block 904, a gate electrode is formed above the substrate. The gate electrode may be made of a conductive material, such as copper, silver, aluminum, manganese, molybdenum, or a combination thereof.

At block 906, a gate dielectric layer is formed above the gate electrode. The gate dielectric layer may be made, for example, silicon oxide, silicon nitride, or a high-k dielectric, such as zirconium oxide, hafnium oxide, or aluminum oxide.

At block 908, an interface layer is formed above the gate dielectric layer. The interface layer may include zinc oxide, IGZO, or a combination thereof. The interface layer may be doped with sulfur, cadmium, or a combination thereof. In some embodiments, the interface layer is made of sulfur-doped zinc oxide, cadmium-doped zinc oxide, sulfur-doped IGZO, cadmium-doped IGZO, or a combination thereof. In embodiments in which the gate dielectric layer is made of silicon nitride, the interface layer may be made of silicon oxide. The interface layer may have a thickness of, for example, between about 2 nm and about 12 nm, preferably between about 5 nm and about 10 nm.

At block 910, an IGZO channel layer is formed above the interface layer. In some embodiments, the IGZO within the IGZO layer is deposited as a-IGZO. However, in some embodiments, the IGZO is formed or deposited using processing conditions to enhance the crystalline structure thereof.

At block 912, source and drain electrodes are formed above the interface layer. The source and drain electrodes may made of, for example, titanium, aluminum, molybdenum, copper, copper-manganese alloy, or a combination thereof.

Although not shown, in some embodiments, the method 900 includes the formation of additional components of an IGZO device, such as a passivation layer, as well as additional processing steps, such as an annealing process. At block 914, the method 900 ends.

Thus, in some embodiments, a method for forming an IGZO device is provided. A substrate is provided. A gate electrode is formed above the substrate. A gate dielectric layer is formed above the gate electrode. An interface layer is formed above the gate dielectric material. An IGZO channel layer is formed above the interface layer. A source electrode and a drain electrode are formed above the IGZO channel layer. The interface layer includes a material different than that of the gate dielectric layer and the IGZO channel layer.

In some embodiments, a method for forming an IGZO device is provided. A substrate is provided. A gate electrode is formed above the substrate. A gate dielectric layer is formed above the gate electrode. An interface layer is formed above the gate dielectric layer. The interface layer includes sulfur-doped zinc oxide, cadmium-doped zinc oxide, sulfur-doped IGZO, cadmium-doped IGZO, or a combination thereof. An IGZO channel layer is formed above the interface layer. A source electrode and a drain electrode are formed above the IGZO channel layer.

In some embodiments, an IGZO device is provided. The IGZO device includes a substrate. A gate electrode is formed above the substrate. A gate dielectric layer is formed above the gate electrode. An interface layer is formed above the gate dielectric material. An IGZO channel layer is formed above the interface layer. A source electrode and a drain electrode are formed above the IGZO channel layer. The interface layer includes a material different than that of the gate dielectric layer and the IGZO channel layer.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A method for forming an indium-gallium-zinc oxide (IGZO) device, the method comprising:
   providing a substrate;
   forming a gate electrode above the substrate;
   forming a gate dielectric layer above the gate electrode;
   forming an interface layer above the gate dielectric material;
   forming an IGZO channel layer above the interface layer;
   forming a source electrode above the IGZO channel layer;
   forming a drain electrode above the IGZO channel layer; and
   wherein the interface layer comprises a material different than that of the gate dielectric layer and the IGZO channel layer, the material comprising sulfur-doped IGZO.

2. The method of claim 1, wherein the interface layer consists of sulfur-doped IGZO.

3. The method of claim 2, wherein the IGZO channel layer is formed directly on the interface layer.

4. The method of claim 3, wherein the interface layer is formed using physical vapor deposition (PVD).

5. The method of claim 4, wherein the IGZO channel layer has a thickness of between about 10 nm and about 100 nm.

6. The method of claim 5, wherein the gate dielectric layer has a thickness of between about 10 nm and about 500 nm.

7. The method of claim 1, wherein the gate dielectric layer comprises silicon nitride.

8. The method of claim 2, wherein the interface layer is formed directly on the gate dielectric layer.

9. The method of claim 1, further comprising forming a passivation layer above the source electrode and the drain electrode.

10. The method of claim 9, wherein the substrate comprises glass, a semiconductor material, or a combination thereof.

11. A method for forming an indium-gallium-zinc oxide (IGZO) device, the method comprising:
    providing a substrate;
    forming a gate electrode above the substrate;
    forming a gate dielectric layer above the gate electrode;
    forming an interface layer above the gate dielectric layer, wherein the interface layer consists of sulfur-doped IGZO;
    forming an IGZO channel layer above the interface layer;
    forming a source electrode above the IGZO channel layer; and
    forming a drain electrode above the IGZO channel layer.

12. The method of claim 11, wherein the IGZO channel layer is formed directly on the interface layer.

13. The method of claim 12, wherein the interface layer is formed directly on the gate dielectric layer.

14. The method of claim 13, wherein the gate dielectric layer comprises zirconium oxide, hafnium oxide, or aluminum oxide.

15. The method of claim 14, further comprising forming a passivation layer above the source electrode and the drain electrode.

16. An indium-gallium-zinc oxide (IGZO) device comprising:
    a substrate;
    a gate electrode formed above the substrate;
    a gate dielectric layer formed above the gate electrode;
    an interface layer formed above the gate dielectric material;
    an IGZO channel layer formed above the interface layer;
    a source electrode formed above the IGZO channel layer; and
    a drain electrode formed above the IGZO channel layer;
    wherein the interface layer comprises a material different than that of the gate dielectric layer and the IGZO channel layer, the material comprising sulfur-doped IGZO.

17. The IGZO device of claim 16, wherein the interface layer consists of sulfur-doped IGZO.

18. The IGZO device of claim 16, wherein the IGZO channel layer is formed directly on the interface layer.

19. The IGZO device of claim 16, wherein the gate dielectric layer comprises zirconium oxide, hafnium oxide, or aluminum oxide.

20. The IGZO device of claim 16, further comprising a passivation layer formed above the source electrode and the drain electrode.

* * * * *